United States Patent [19]

Khan et al.

[11] Patent Number: 5,182,670
[45] Date of Patent: Jan. 26, 1993

[54] NARROW BAND ALGAN FILTER

[75] Inventors: Muhammad A. Khan, White Bear Lake; Jonathon N. Kuznia, Bloomington; James M. Van Hove, Eagan, all of Minn.

[73] Assignee: APA Optics, Inc., Blaine, Minn.

[21] Appl. No.: 755,510

[22] Filed: Aug. 30, 1991

[51] Int. Cl.$^5$ .................... G02B 5/28; F21V 9/04; H01L 27/14

[52] U.S. Cl. .................... 359/359; 252/588; 359/361; 359/578; 359/589; 257/17; 257/22; 257/21; 257/76; 257/201

[58] Field of Search .................. 357/30; 359/359, 361, 359/582, 578, 579, 586, 589; 252/588

[56] References Cited

U.S. PATENT DOCUMENTS

| | | | |
|---|---|---|---|
| 4,300,811 | 11/1981 | Ettenberg et al. | 359/359 |
| 4,368,098 | 1/1983 | Manasevit | 156/606 |
| 4,404,265 | 9/1983 | Manasevit | 428/689 |
| 4,614,961 | 9/1986 | Khan et al. | 357/30 |
| 4,616,248 | 10/1986 | Khan et al. | 357/30 |
| 4,666,250 | 5/1987 | Southwell | 356/361 |
| 4,999,842 | 3/1991 | Huang et al. | 372/45 |
| 5,012,486 | 4/1991 | Luryi et al. | 372/45 |
| 5,052,008 | 9/1991 | Kemeny | 372/45 |

OTHER PUBLICATIONS

"High Efficiency (1.2 mW/mA) Top-Surface-Emitting GaAs Quantum Well Lasers at 850 nm, " Lee, et al., IEEE Photonics Technology Letters, vol. 2, No. 9, pp. 685–688, Sep. 9, 1990.

"Photoluminescence Characteristics of AlGaN–GaN–AlGaN Quantum Wells, " Khan et al., Appl. Phys. Lett., vol. 56, No. 13, pp. 1257–1259, Mar. 1990.

"Properties and Ion Implantation of $Al_xGa_{1-x}N$ Epitaxial Single Crystal Films Prepared by Low Pressure Metalorganic Chemical Vapor Deposition, " Khan et al., Appl. Phys. Lett., vol. 43, No. 5, pp. 492–494, Sep. 1983.

"Electrical Properties and Ion Implantation of Epitaxial GaN, Grown by Low Pressure Metalorganic Chemical Vapor Deposition, " Khan et al., Appl. Phys. Lett., vol. 42, No. 5, pp. 430–432, Mar. 1, 1983.

"Properties of Zn–doped VPE–Grown GaN.1. Luminenscence Data in Relation to Doping Conditions, " Monemar et al., Journal of Applied Physics, vol. 51, No. 1, pp. 625–639, Jan. 1980.

"Epitaxial Growth of GaN/AlN Heterostructures, Yoshida et al., Journal of Vacuum Science Technology, " vol. 1, No. 2, pp. 250–253, Apr.–Jun. 1983.

"P–Type Conduction in Mg–Doped GaN Treated with Low-Energy Electron Beam Irradiation (LEEBI), " Amano et al., Japanese Journal of Applied Physics, vol. 28, No. 12, pp. L2112–L2114, Dec. 1989.

"Effects of the Buffer Layer in Metalorganic Vapour Phase Epitaxy of GaN on Sapphire Substrate, " Amano, et al, Thin Solid Films, 163, pp. 414–421, 1988.

"Stimulated Emission Near Ultraviolet at Room Temperature from a GaN Film Grown on Sapphire by MOVPE Using an AlN Buffer Layer, " Japanese Journal of Applied Physics, vol. 29, No. 2, pp. L205–L206, Feb. 1990.

"Improvements on the Electrical and Luminescent Properties of Reactive Molecular Beam Epitaxially Grown GaN Films by Using AlN-coated Sapphire Substrates, " Yoshida et al., Appl. Phys. Lett., vol. 42, No. 5, pp. 427–429, Mar. 1983.

Primary Examiner—Martin Lerner
Attorney, Agent, or Firm—Merchant, Gould, Smith, Edell, Welter & Schmidt

[57] ABSTRACT

The invention is a filter device of at least two layers, the first layer of $Al_xGa_{(1-x)}N$ and the second layer of $Al_yGa_{(1-y)}N$ wherein x and y may have any value from 0 to 1. The invention may be used as a fixed wavelength or tunable wavelength filter or in ultraviolet detectors and laser devices, among other systems. Applications for the invention include detection of UV radiation in environments having a high level of incident infrared and visible radiation, as well as applications requiring detection of UV emission when no other radiation is present.

24 Claims, 8 Drawing Sheets

FIG. 3

FIG. 2
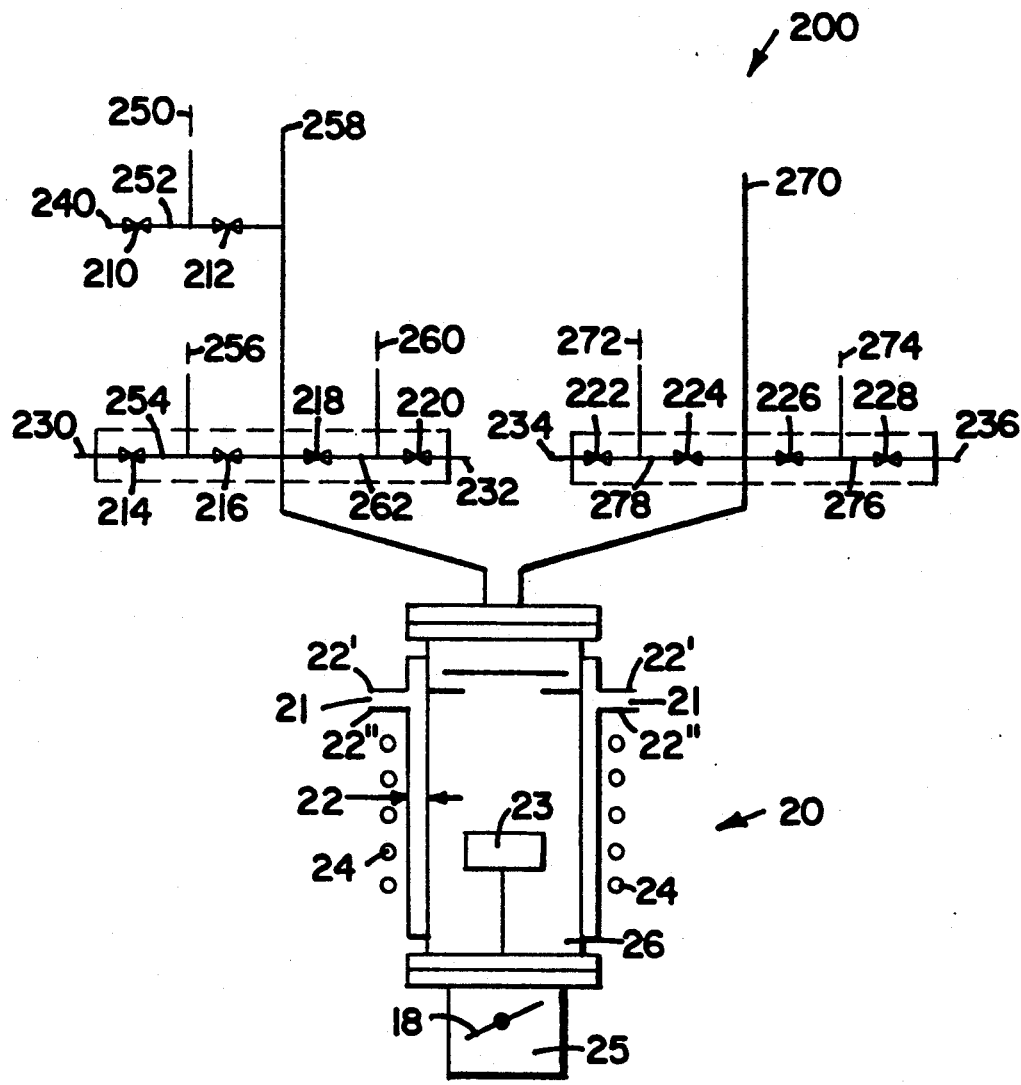
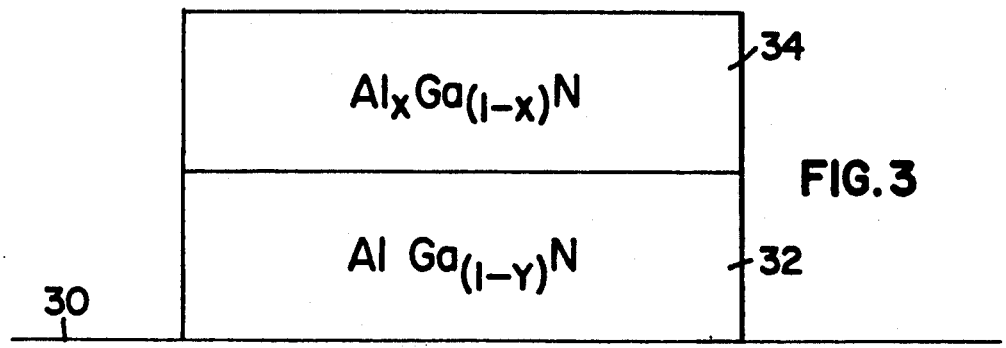
FIG. 3

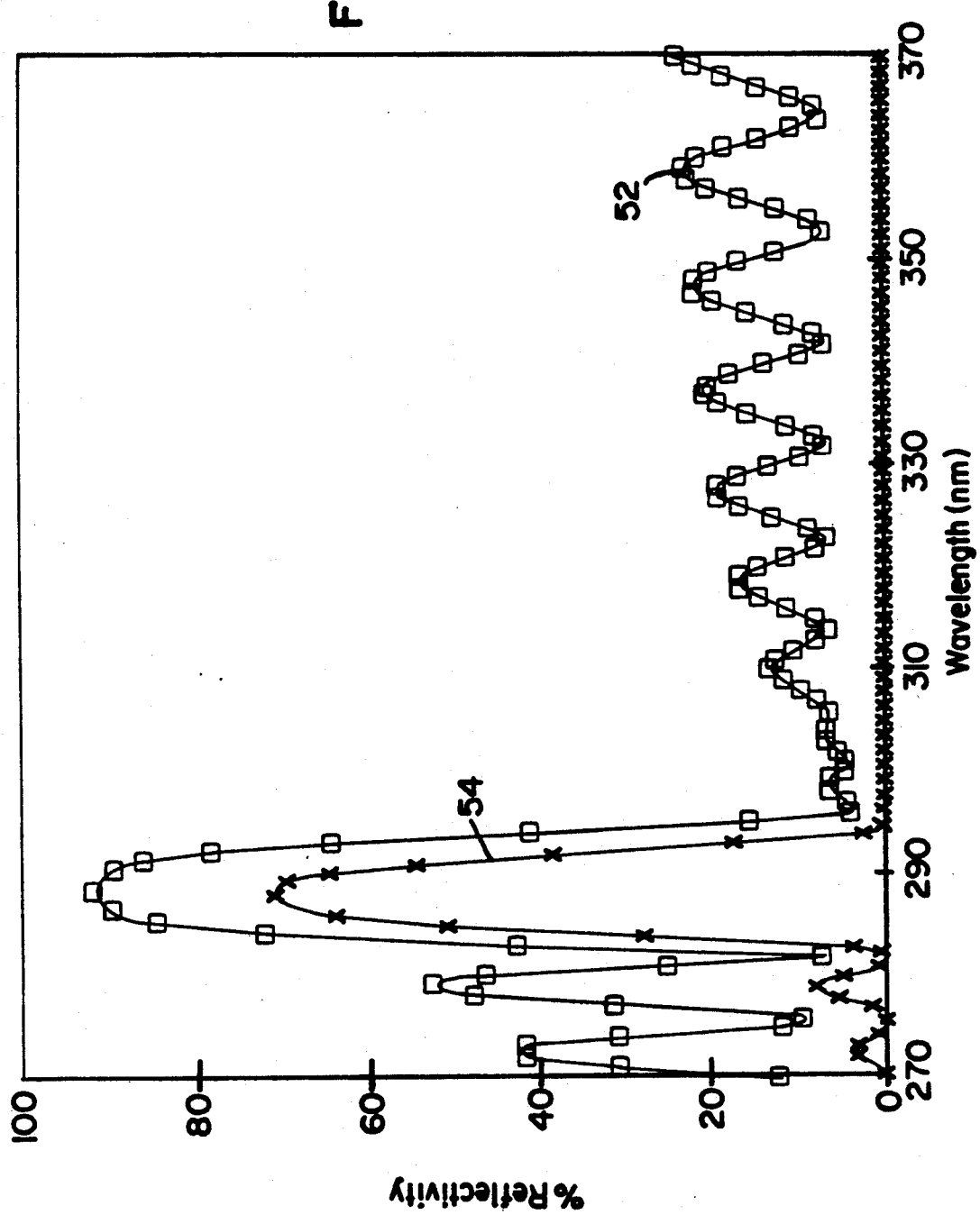

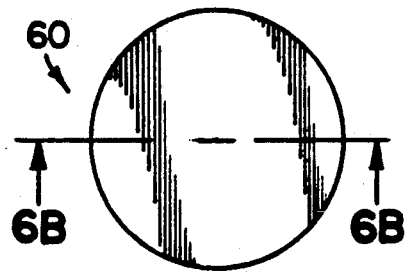
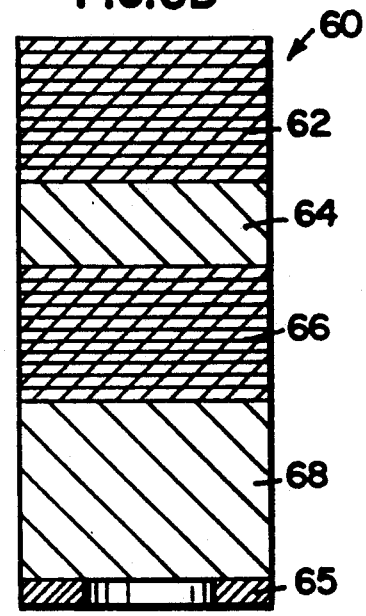
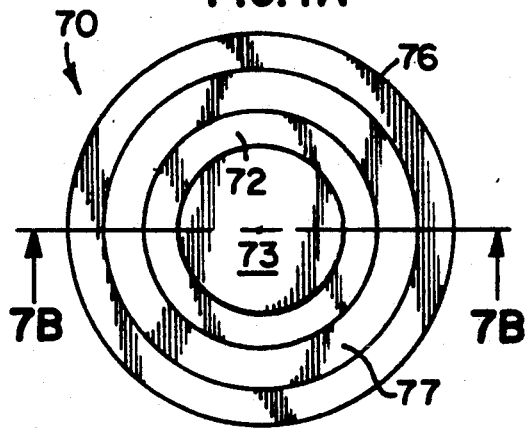
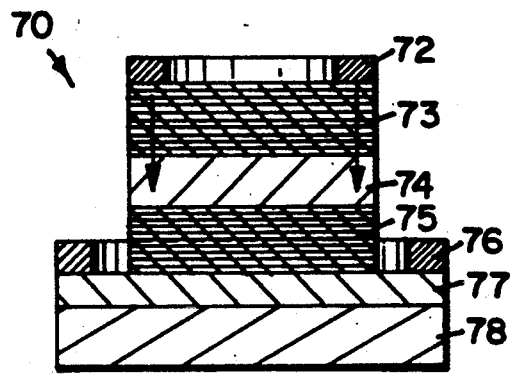
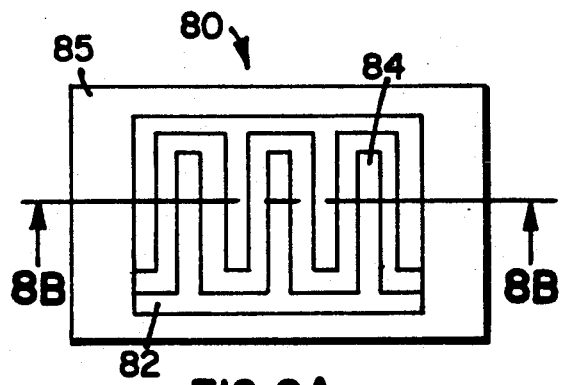
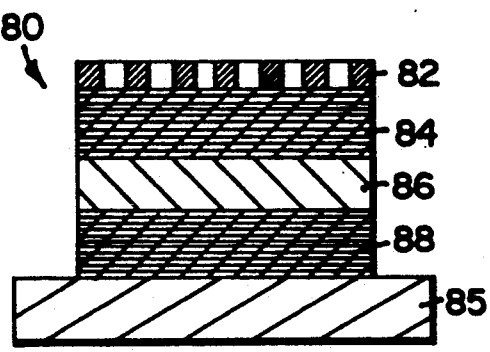

400 nm Filter 450 nm Filter

NARROW BAND ALGAN FILTER

FIELD OF THE INVENTION

The invention relates generally to aluminum-gallium-nitride filters. More specifically, the invention relates to aluminum-gallium-nitride filters useful in quarter wavelength stacks for the detection of ultraviolet, visible, and infrared wavelengths.

BACKGROUND OF THE INVENTION

Detectors and sensors find many applications in commercial and defense environments. In application, ultraviolet (UV) detectors have great selective sensitivity with no response for wavelengths exceeding 290 nanometers.

UV sensors offer several advantages over present infrared (IR) and radar based sensors. Unlike IR sensors, ultraviolet sensors can easily distinguish between the hot plume emitted from a rocket on lift off and the rocket itself. Further, the UV sensors are smaller, less expensive and do not require cooling during operation. UV sensors are also not overloaded by other sources of radiation such as explosions from conventional or nuclear devices.

Ultraviolet detection is also at the heart of several commercial applications. These applications include industrial and residential flame safeguards. Safety considerations require these sensors to be installed at every oil and gas power facility, as well as residential and commercial boilers and oil heaters. The development of highly sensitive UV sensors is desirable to meet the needs of these commercial and defense applications.

Two common requirements that all these application areas impose on the sensor system are high sensitivity and a high rate of rejection for IR/visible energy. The high sensitivity requirement necessitates the use of a high gain photoconductor or photocathode sensor based on a material system with a direct bandgap matching the desired detection wavelength.

The second key requirement is that of a sharp, long wavelength cutoff. While wavelength cutoff may be improved by using thin film filters, the material choices for these thin film filters are very limited for the wavelengths of interest. Organic materials presently used make the filters very fragile but also greatly reduce the peak transmission.

It is therefore highly desired to develop a sturdy, high rejection filter suitable for use in conjunction with UV sensors for a variety of applications.

SUMMARY OF THE INVENTION

In accordance with a first aspect of the invention there is provided a filter device of at least two layers, the first layer comprising $Al_xGa_{(1-x)}N$ wherein x has a value ranging from about 0 to 1, and the second layer comprising $Al_yGa_{(1-y)}N$ wherein y has a value ranging from about 0 to 1.

In accordance with a further aspect of the invention there is provided a laser device having an intermediate laser diode of a PN junction and the filter device of the invention. In accordance with a further aspect of invention there is provided a process for the formation of an AlGaN filter.

The invention provides a hard durable material that can be used in chemically hostile environments as it is not sensitive to acid or alkaline substances. Generally formed on a substrate of sapphire, the single crystal layers of the invention are lattice matched as the lattice constants of aluminum nitride and gallium nitride are substantially similar. The lattice mismatch of the substrate with the filter layers is avoided by the use of a buffer of aluminum nitride. As a result, lattice stresses in the material are minimal creating a structure which supports a high physical integrity and a large thickness without concern for peeling or cracking.

BRIEF DESCRIPTION OF THE DRAWINGS

FIG. 2 is a schematic depiction of one metal organic chemical vapo deposition system useful in fabricating filters in accordance with the present invention.

FIG. 3 is a side plan view of an aluminum gallium nitride filter in accordance with one aspect of the present invention.

FIG. 5A is a graphical representation of the effect of reflectivity on wavelength in accordance with one embodiment of the invention.

FIGS. 6A and 6B are a top plan view and cutaway side view, respectively, of a Fabry-Perot type filter in accordance with one embodiment of the invention.

FIGS. 7A and 7B are a top plan view and a side cutaway view, respectively, of a tunable Fabry-Perot type filter in accordance with an alternative embodiment of the invention.

FIGS. 8A and 8B are a top plan view and a side cutaway view, respectively, of an alternative embodiment of a Fabry-Perot tunable filter in accordance with the invention.

DETAILED DESCRIPTION OF THE PREFERRED EMBODIMENTS

Figure 1:
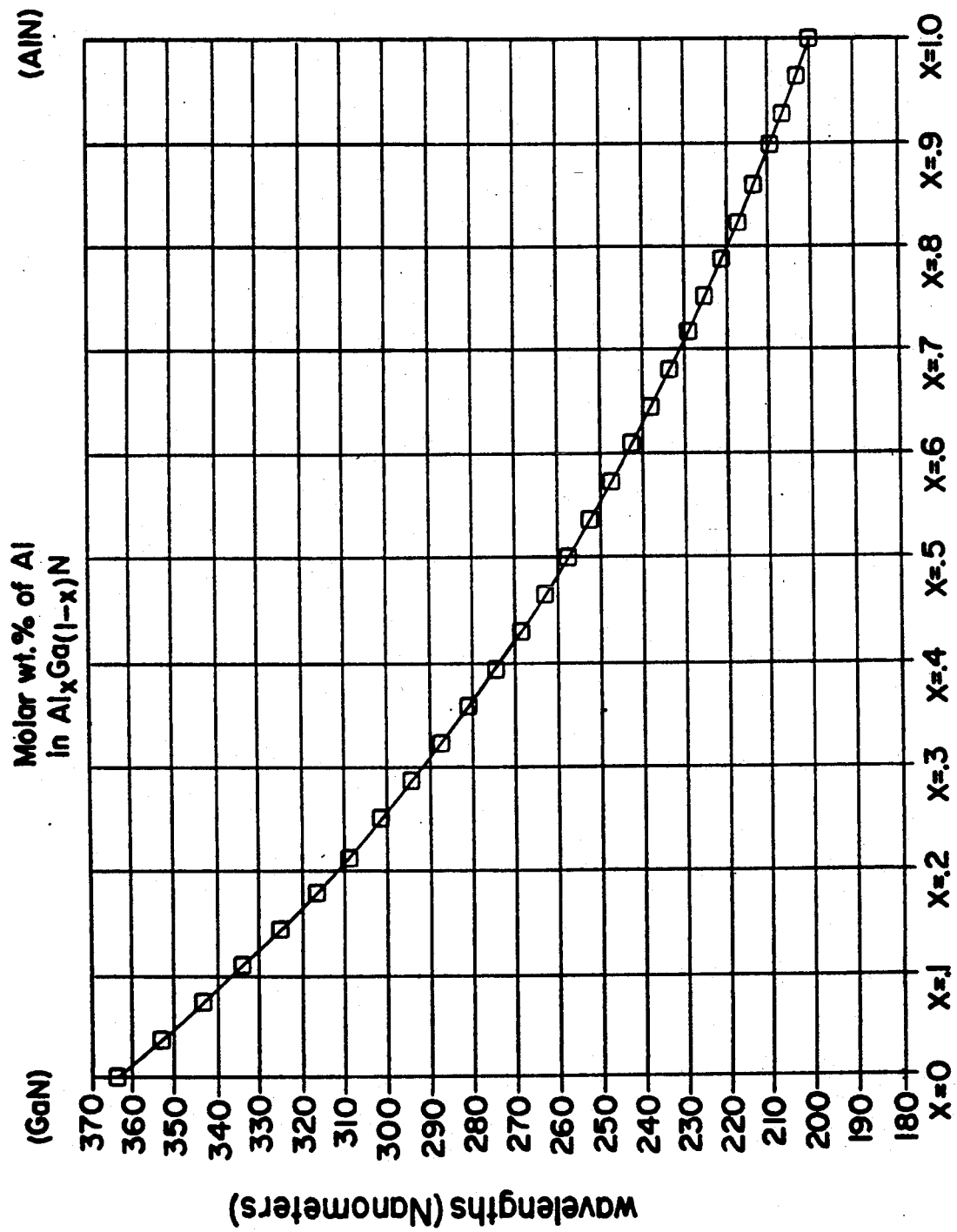
FIG. 1 is a graphical representation of the change in bandgap wavelength versus molar concentration of aluminum in aluminum gallium nitride compositions.

The compounds formed by Group IIIA elements of the Periodic Table being aluminum, gallium, and indium with Group VA elements such as nitrogen, phosphorus, arsenic, and antimony are extremely important semiconductor materials. The attractiveness of Group III-V components as electronic materials lies in the variability of electrical properties among the different compounds and the fact that these properties are often superior to those found in silicon.

Perhaps the most important property of Group III-V materials is the ability to form completely miscible solid solutions for most of the multicomponent systems. This is accomplished either by the substitution of an atom of Group III sublattice, for example, gallium by another Group III element, for example, indium or the substitution of an atom on the Group V sublattice, for example, arsenic by another Group V element, for example, phosphorus.

By the variation of solid solution compositions, the electrical properties of the solid are affected. This affords the device designer the ability to tune the electrical properties of the solid to fit particular device requirements.

ALUMINUM GALLIUM NITRIDE FILTERS

We have found that one application for Group III-V alloys is in the production of optical filters. Optical filters are used widely in engineering, research, and photography when spectral radiant energy must be altered, modulated, or controlled precisely. Generally, filters may be designed to allow complete transmission of energy, partial reflectance, or complete reflectance of all energy incident to the substrate.

We have found that by repeating layers of varying thickness and constituent molar concentration of aluminum gallium nitride, AlGaN, that UV filters of variable but adjustable bandgap can be produced. These filters find definite commercial utility in many applications.

Generally, ultraviolet filters of the variety disclosed herein are regarded as quarter wavelength stack devices and have physical parameters that are in accord with the following relationship:

$$\lambda_D/4 = n_1 d_1 \quad (1)$$

wherein $\lambda_D$ is the wavelength to be transmitted through the filter, $n_1$, is the refractive index of the material and $d_1$ is the material thickness.

In accord with the present invention, we have found that the use of two AlGaN layers having varying molar concentrations of aluminum, respectively, allows the formation of filters with greater wavelength tunability. The aluminum-gallium-nitride (AlGaN) layers may have varying aluminum concentrations which in turn, varies the wavelength selectivity (bandwidth) of the material.

In this case the filter device has physical parameters that are in accord with the following relationship:

$$\lambda_D/4 = n_1 d_1 = n_2 d_2 \quad (2)$$

wherein $\lambda_D$ is the wavelength of the energy to be transmitted through the filter, $n_1$ is the refractive index of the first layer, $n_2$ is the refractive index of the second material, $d_1$ is the thickness of the first material and $d_2$ is the thickness of the second material.

In defining a filter selective to a specific wavelength, the concentration of aluminum within the composition may be varied wherein x or y may range from 0 to 1 mole. As can be seen in FIG. 1, varying the concentration of aluminum will vary the bandgap and the wavelength of light transmitted through a given ternary AlGaN structure.

As can be seen, increasing the molar aluminum concentration decreases the wavelength in Angstroms of light transmitted through the structure. Decreasing the molar Al concentration will have the opposite effect on the system. Generally, given the preferred wavelength, the aluminum concentration for x will vary from about 0 moles to 1 mole, preferably from about 0.5 mole to 1 mole, and most preferably from about 0.8 mole to 1 mole.

Within the same range of molar Al concentration, the refractive index ($n_1$) of the material will vary from about 2.2 to 2.8, and most preferably from about 2.3 to 2.8.

In accordance with the relationship disclosed in equation (2) the thickness of each layer may be varied to assist in defining wavelength selectivity. Generally, the thickness of the individual layers may vary from about 200 Å to 5000 Å, preferably from about 200 Å to 1000 Å, and most preferably from about 200 Å to 500 Å.

FABRICATION PROCESS

The aluminum gallium arsenide filter structure of the present invention may be formed through any number of processes known to those with skill in the art. CVD system useful in forming the filter of the invention include those disclosed in U.S. Pat. Nos. 4,368,098 and 4,404,265 incorporated herein by reference. Generally, chemical vapor depositions (CVD) such as metal organic chemical vapor deposition techniques may be used. One CVD system which may be used is that schematically depicted in FIG. 2.

The chamber 20 is surrounded by a double wall of hardened material 22, preferably quartz. Water is circulated through the wall 22, within the jacketed area 21 formed by the inner wall 22' and the outer wall 22". The chamber also comprises a stand 23 which may comprise a graphite susceptor, on which to hold and heat the filter substrate during the deposition process. The susceptor may generally be heated by means such as rf coils 24 positioned to surround the wall 22 of the chamber 20. During device formation the chamber 20 is generally placed under vacuum through pump 25.

Supplying the metal organic gases used to form the filter is a plumbing system 200. Any number of species of gaseous compounds, metal organic or otherwise, may be communicated to the chamber 20 through the plumbing system. Control of these gases may be obtained by various valves and dump points. Any number of piping materials may be used such as stainless steel, polyvinyl chloride, butyl rubber and the like as long as the piping remains nonreactive to the gases introduced.

In the CVD system shown in FIG. 2, one means of introducing gases into the system may be to introduce hydrogen as a carrier or diluent at lines 258 and 270. Triethylgallium may be introduced at line 256 with flow being monitored in line 254 by valves 214 and 216 placed on either side of line 254, into which the metal organic gallium gas feeds. Similarly, triethylaluminum is fed into the chamber at line 260 with similar valves 218 and 220 being placed on either side of line 262. Nitrogen species may be generally introduced into the system at lines 272 and 274 such as ammonia or hydrazine, respectively. Here again, valves 222, 224, 226 and 228 are used to monitor the flow of gas in liner 278 and 276, as indicated in the Figure, towards the reactor or towards the various dump points located throughout the plumbing. Additionally, other gaseous constituents such as diethyl zinc may be introduced into line 250 and controlled by valves 210, 212 in line 252 to direct the gas either towards the chamber or towards the dumping area.

Dump points 230, 232, 234, 236 and 240 are located throughout the plumbing system and allow immediate control and bypass of gaseous constituents into or out of the system by manipulation of the in-line valve closest to the dump point. The system has a closed loop pressure control 18 which can be used to deposit AlGaN at the pressures required by processing.

Generally, in the formation of AlGaN structures having varying molar concentrations of aluminum, several parameters are critical. Generally, the temperature formation of the filters ranges from about 700° to 1100° C., preferably from about 900° to 1100° C. Further, time for deposition depends tremendously on the aluminum concentration within the AlGaN filter.

Depending on whether the aluminum constituent is present at 0 mol-% or 1 mol-%, deposition times may range from 400 to 800 minutes. Preferably, however, molar concentrations of aluminum will generally range within 0.2 to 1 mole maintaining deposition times and processing times within the range of 500 to 800 minutes.

Any number of commercially available gases may be used in the formation of the filter of the invention. These gases may optionally be subjected to filtration processes for gases known to those of skill in the art. Various constituents may be used to provide aluminum and gallium as well as nitrogen. Generally, nitrogen is provided by $NH_3$ or hydrazine, among others. Gallium may be provided by metal organic sources such as triethylgallium, trimethylgallium, and ethyldimethylgallium, among others. Aluminum may be provided by metal organic sources such as triethylaluminum, trisobutylaluminum, trimethylaluminum and diisobutylaluminum, among others. These constituents should be considered merely representative as any metal organic constituent may be used which provides a gaseous species capable of adequately depositing the intended metal on the chosen substrate during processing.

In one system, a basal plane sapphire substrate (up to 2" diameter and 2 mm thick) may be loaded onto a silicon carbide coated graphite susceptor 23 (FIG. 2) which is heated through rf coupling 24. Prior to deposition and loading the sapphire substrates may be cleaned in organic solvents and etched in a solvent such as hot $H_2SO_4$ or $H_3PO_4$ to etch off the polishing damage.

The sapphire substrates are then heated and an aluminum nitride layer is deposited. Deposition temperatures may range from about 600° C. to 1000° C. and preferably 600° C. with the thickness of the aluminum nitride layer ranging from about 200 to 700 Å, and preferably about 500 Å. A buffer layer of AlGaN may then be deposited on the aluminum nitride layer preferably at temperatures of about 1040° C. The reactor pressure may range from about 20–760 Torr and preferably about 76 Torr. The layers of the filter may then be grown in an alternating sequence. Preferably the stack is terminated with the material of a higher refractive index.

Once the filter is complete, the filter stack may be cooled under an inert gas such as ammonia until the temperature falls to a reasonable level, preferably about 300° C.

Generally, metal organic and carrier gaseous species may be flowed into the reaction chamber at any variety of rates depending upon the molar concentration of the intended filter. Specifically, gallium species may be flowed at a rate of about 5 to 100 standard cubic centimeters/minute (SCCM), most preferably about 25 to 50 SCCM. Aluminum species may be flowed at a rate of about 5 to 100 SCCM, and most preferably about 25 to 50 SCCM. Nitride species may be flowed at a rate of about 1 to 5 standard liters per minute (SLM), and most preferably about 1 to 3 SLM.

Carrier gases and inert cooling gases may be flowed at about 2 to 5 SLM, and most preferably about 2 to 3 SLM. As those of skill in the art will appreciate, gas flow for each constituent into the chamber will determine the molar concentration of that constituent in the resulting filter. The flow rate versus concentration plot will vary for each constituent but those skilled in the art of CVD can readily adduce proper parameters to form the filter claimed herein.

The basic structure of the invention can be seen in FIG. 3. As can be seen, a first layer of AlGaN 32, is deposited on a substrate 30. A second layer of AlGaN 34 is then deposited over the first layer of AlGaN. By varying the concentration of aluminum within the two layers, as well as the thickness of the layers, the filter may be converted from completely transmissive to completely reflective. The filter may be adjusted to allow for complete or selective transmission of frequencies within the visible, infrared, or ultraviolet wavelengths. Generally, the invention has applicability to wavelengths ranging from 200 nanometers to 10,000 nanometers, preferably from about 200 nanometers to 1000 nanometers, and most preferably from about 200 nanometers to 360 nanometers.

Once an AlGaN filter is fabricated, devices may be made fairly easily. This may be done with conventional photoresist liftoff processing and e-beam metal deposition.

DEVICE APPLICATIONS

Generally, wavelength selectivity can be monitored to reflect or filter any number of different wavelengths. For example, the filter of the invention may be used in conjunction with detectors implemented in the monitoring of flame systems for boilers, furnaces, heat pumps, and the like. The filter device of the invention may be used with any number of detectors or sensors sensitive to UV, IR, or visible radiation, known to those of skill in the art.

To this end, the filter assists the detector in discerning the radiation resulting from the flame component within the heating apparatus and thermal radiation resulting from the heating of the components other than the flame within the furnace by the flame.

Similarly, the filter may be used to assist sensors in detecting flame components present in solar blind operations such as in satellites focused on the earth.

The problem of detecting ultraviolet radiation in the presence of large amounts of IR and visible light is most evident in satellite sensor systems. The ozone layer around the earth completely cuts off all radiation under 290 nm. Therefore if the sensor does not respond to radiation with wavelengths larger than 290 nm, the earth appears completely dark. Any rocket emerging from under the ozone layer produces a strong UV signal across this dark background. The invention, a $Al_{x}Ga_{1-x}N$ based filter composed of quarter wave interference filters combined with an ultraviolet detector addresses this problem.

A quarter wave stack generally includes alternating layers of two materials with different refractive indices. The optical thickness (physical thickness multiplied by the refractive index) of each layer is a quarter of the selected wavelength. Thus for a quarter wave stack, the reflection R (equation 3), the transmission T (equation 4) and the width of the high reflectance band width $d_w$ (equation 5) can be approximated by:

$$R = [\lambda - (n_n/n_l)^{2P}(n_h2/n_s)]/[\lambda + (n_h/n_l)^{2P}(n_h2/n_s)] \quad (3)$$

$$T = 4(n_ln_h)^{2P}(n_s/n_h2) \quad (4)$$

$$d_w = (4\lambda)/\lambda \operatorname{Sin}^{-1}[(n_h - n_c)/(n_h + n_c)] \quad (5)$$

Wherein $n_h$ and $n_l$ the high and low refractive indices, p is the total number of periods and $n_s$ is the refractive index of the substrate. Incident light is partially reflected and partially transmitted at each interface. The amplitude reflection coefficient for light incident normally at an interface between materials of refractive indices $n_a$ and $n_b$ is $$r = (n_a - n_b)/(n_a + n_b) \quad (6)$$

At each interface the same fraction of light is reflected. At the wavelength for which the layers are a quarter-wavelength thick, the reflections are in phase and if there are enough layers, nearly all of the light is reflected. For other wavelengths, the reflections are not in phase and a strong reflection is not obtained.

Figure 4:
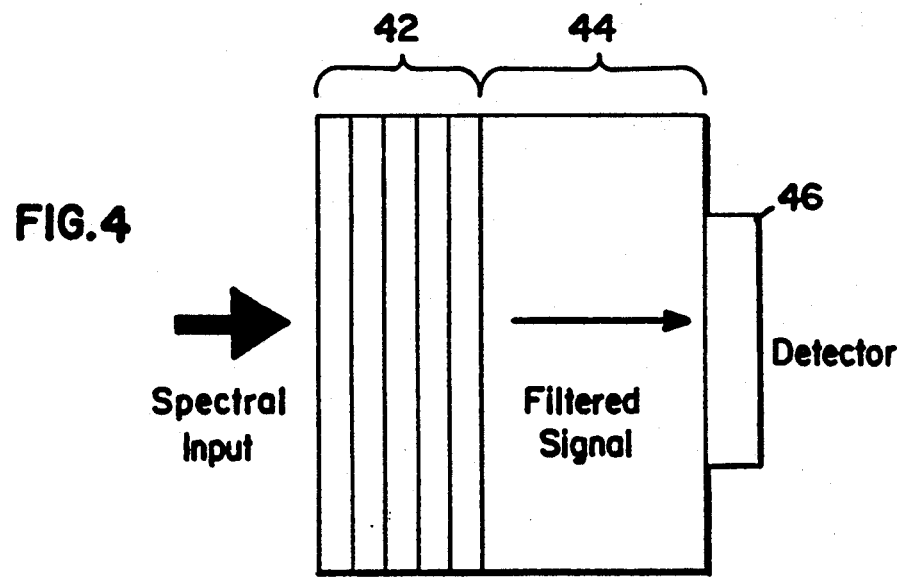
FIG. 4 is a side plan view of a filtered ultraviolet detector in accordance with one aspect of the invention.

One filter-detector which may be made in accordance with the invention is seen in FIG. 4. The device comprises a quarter wave interference filter 42 and an intrinsic $Al_xGa_{l-x}N$ high gain photoconductor detector 46 deposited on the opposite faces of a basal plane sapphire substrate 44 known to those of skill in the art. In one application the filter may comprise alternating layers of aluminum nitride and $Al_{0.8}Ga_{0.2}N$ with thicknesses of 308 nm and 300 nm, respectively. These are selected to satisfy the quarter wave thickness requirement which demand:

$$n_ld_l = n_2d_2 = \lambda/4 \text{ where } \lambda = 290 \text{ nm.} \quad (7)$$

Figure 5B:
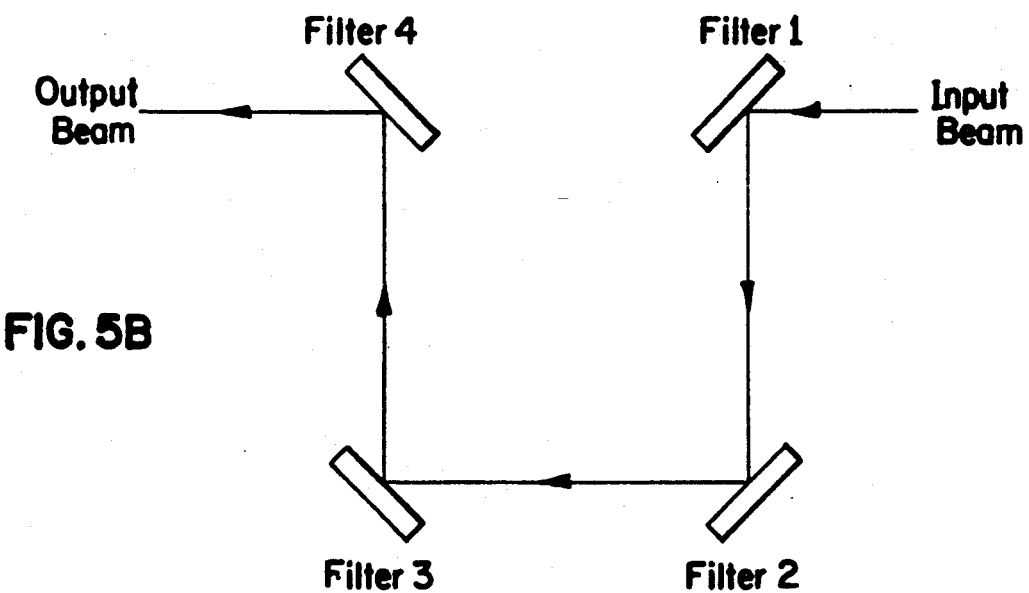
FIG. 5B is a schematic representation of an apparatus in accordance with the invention comprising four AlGaN filters in series.

Using 18 periods and a filter of 1.1 micron thickness for a bandgap of 290 nm, the reflectivity of this system as shown as modeled in FIG. 5A at plot 52. Plot 54, in FIG. 5A, shows a model of the %-reflectivity for a filter comprising four vertical stacks of 18 periods per stack for the apparatus shown in FIG. 5B. The output beam will have a reflectivity plot substantially similar to plot 54 in FIG. 5A.

While the peak reflection is around 290 nm, this peak can easily be moved by selecting a molar aluminum concentration different from the 80% as indicated in equation (7). The out of band reflection is only 0.01%. The peak reflection (usable radiation) is around 70%. The stacking arrangement depicted in FIG. 5B greatly reduces the out of band reflection as seen in plot 54, FIG. 5B.

A Fabry-Perot cavity filter may also be fabricated according to the invention comprising two quarter wave mirrors separated by a spacer layer, FIGS. 6A and 6B.

As seen, the filter 60 comprises two filters 62 and 66 separated by a spacer 64. Each filter comprises a discrete number of AlGaN layers grown in series to define a wavelength bandgap cutoff. The spacer layer comprises AlGaN grown in accordance with the CVD processes disclosed herein. Generally, the filter assembly may be grown on a substrate 68 chosen from any number of materials such as sapphire.

Finally, a detector 65 may be grown or otherwise attached on the reverse side of the substrate 68. This device produces a narrow transmission resonance for wavelengths for which the thickness of the spacer 64 is an integer number of half wavelengths. The effect of the spacer 64 is to cause a 180° phase shift between the reflected beams from the top filter 62 and the bottom filter 64. If the reflectances of the two mirrors are equal, then unity transmittance is obtained at the resonance.

In this case, the filter may be deposited so that a wavelength such as 290 nm is transmitted through the device and onto the GaN detector. The out of band wavelengths will be reflected away. In addition, the central pass wavelength may be determined by the optical thickness of the spacer region. By changing the refractive index of this layer, the central peak may be shifted to produce a tunable filter.

FIGS. 7A and 7B as well as 8A and 8B show two configurations of a tunable Fabry-Perot filter. A tunable filter may generally require ohmic or schottky contacts and ion milling or reactive ion etching. The sample is generally first coated with photoresist and exposed to reveal the ohmic contact area (the n+aluminum nitride layer). The filter above this layer will be ion milled away. Ohmic metal is then deposited and lifted off using this same resist. The device may then be coated again with resist and the top contact ring may be deposited and lifted off using this same resist. The device may then be coated again with resist and the top contact ring may be deposited and lifted off. A tunable filter may be produced by electrically changing the refractive index of the spacer layer of the Fabry-Perot filter. This will change the optical thickness of the spacer and shift the central peak location.

The top of the filter 73, FIG. 7A, shows a circular structure which may comprise a bottom conducting aluminum nitride layer 77. In between contact 72 and substrate 77 lies a filter (73) - spacer (74) - filter (75) structure with the filters comprising alternating layers of AlGaN in accordance with the invention and the spacer comprising aluminum gallium nitride. An electric field may be applied between the top circular contact 72 and the bottom structure 76. The electric field may be used to modify the refractive index and shift the central location of the filter. The electric field lines (arrows, FIG. 7B) may be vertical in the device and effectively modify the refractive index. Since the detector 78 is on the face opposite the substrate 77 and the filter is transmissive, the bottom electrode 76 must be able to pass 290 nm. This generally requires a high Al molar concentration AlGaN composition and even possibly an aluminum nitride film as layer 77. Further, these films are generally doped since as grown $Al_x$-$Ga_{l-x}N$ films with x greater than 40–50% are insulating.

The second filter configuration, FIGS. 8A and 8B, is an interdigitated structure. Here, a filter - spacer - filter configuration similar to that seen in FIGS. 7A and 7B is formed on a substrate of sapphire and has schottky contacts 82 of metal such as gold, titanium, or chromium, for example deposited on its upper surface. In this device, the electric field is generated by applying a voltage between the interdigitated fingers 82 of a metal such as gold, titanium, or chromium. A fringing electric field will penetrate down to the spacer 86 and modify the refractive index. Applying the field in this manner may be less effective than the circular structure but does not require the use of a conductive bottom electrode.

WORKING EXAMPLES

In accordance with the invention, there is now provided laboratory examples showing fabrication and testing of $Al_xGa_{(l-x)}N$ filter devices. These examples are to be considered nonlimiting and only representative of the claimed invention.

WORKING EXAMPLE 1

A filter stack centered at 450 nm was attempted using alternating layers of AlGaN and GaN with Al having a molar concentration of 15%. The index of refraction for GaN at 450 nm is 2.49. AlGaN (x−15%) has an index of refraction of 2.42 at 450 nm.

Using equation 1, the following thicknesses (T) are needed for the AlGaN and GaN layers; (1) AlGaN $T_1 \times 2.42 = 450$ nm./4 or $T_1 = 46.5$ nm; (2) GaN $T_2 \times 2.49 = 450$ nm/4 or $T_2 = 45.2$ nm.

These layers were deposited using a MOCVD system as described in FIG. 2. Typical growth rates using this system are 0.125 nm/s for 15% AlGaN and 0.132 nm/s for GaN. Based on these rates, the time (t) to deposit the AlGaN layer of thickness $T_1$ (46.5 nm) would be $t_1 = 46.5$ nm/0.125 nm/s = 372 seconds and the time to deposit the GaN layer of thickness $T_2$ (45.2 nm) would be $t_2 = 45.2$ nm/0.132 nm/s = 342 seconds.

The filter stack comprised 17.5 layers. GaN terminated the stack. The structure was subjected to the formation of a 500 Å aluminum nitride buffer at 600° C. by MOCVD. Then GaN growth was initiated for ½ hour at 1040° C. and the 18 period stack growth starting with AlGaN.

The resulting stack comprised a layer of GaN grown on AlN at 1040° C. and then an 18 period stack of AlGaN and GaN deposited to yield a quarter wave stack centered at 450 nm.

Reflectance data shows a reflection peak centered at 405 nm. This is 45 nm from the design value of 450 nm. This is expected to result from a change in expected thickness.

WORKING EXAMPLE 2

A filter stack was grown with 12 periods of AlGaN/GaN with x=33% on a ½ micron buffer layer of GaN. Following growth, the reflectivity of the filter was measured to be 360 nm. Then the sample was reinserted into the growth chamber with the filter stack down and a ½ micron buffer layer of GaN was deposited. The reflectivity was then remeasured.

The reflectivity of the filter was centered at 360 nm. This example illustrated that a filter can be grown, and subsequently a detector may be grown on the underside of the filter without affecting the characteristics of the filter.

WORKING EXAMPLE 3

The refractive index of $Al_xGa_{1-x}N$ from 360 to 500 nm was measured to design filters with peak reflectives close to the bandgap wavelength. These refractive index measurements were based on an interference procedure using a UV-Vis spectrometer. Using these measured refractive index values quarter wave filter stacks were designed for peak reflectivities centered at 400 and 450 nm. The designs were based on GaN and $Al_{0.2}Ga_{0.8}N$ as the high/low refractive index layers, respectively, the quarter wavelength requirement of $n_id_i = \lambda \cdot /4$ and a total of eighteen quarter wave periods. Here $n_1$ was the refractive index, d was the thickness of the layer, and $\lambda \cdot$ was the desired reflectivity peak.

Figure 9:
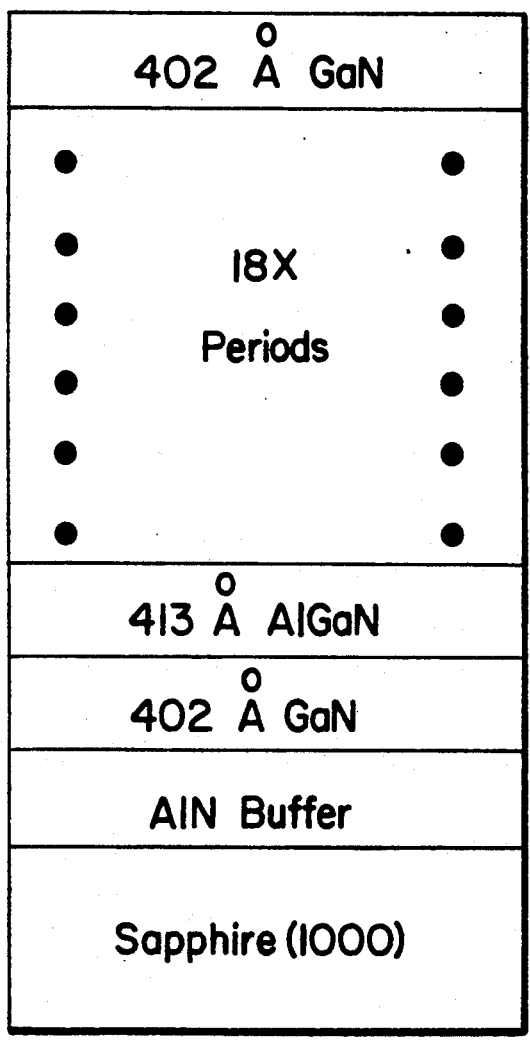
FIG. 9 is a schematic representation of an ultraviolet filter in accordance with one aspect of the present invention.
Figure 10:
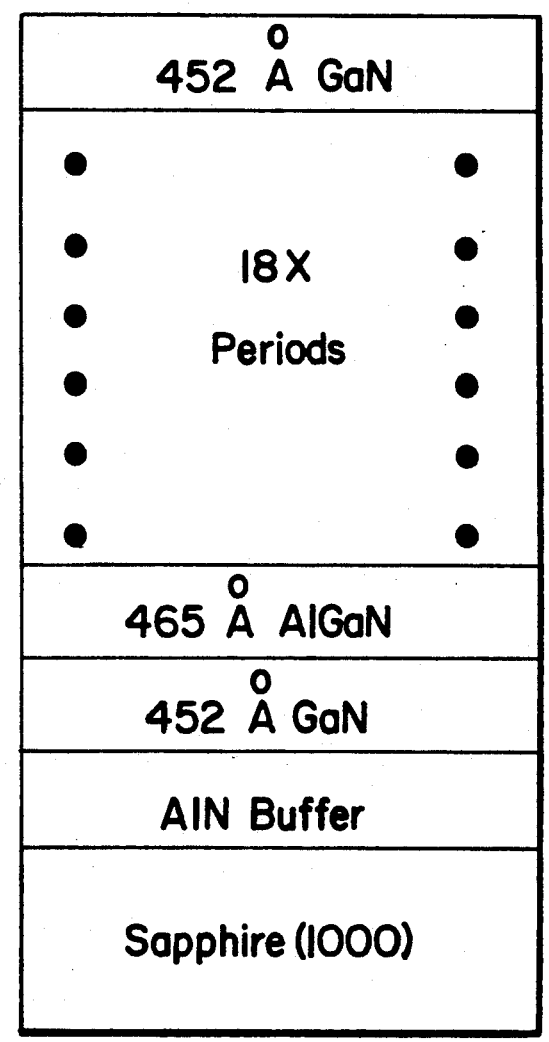
FIG. 10 is a schematic view of an aluminum gallium nitride filter in accordance with a further alternative embodiment of the invention.

FIGS. 9 and 10 are schematic representations of the epilayers for the 400 and 450 nm filter designs, respectively.

The designed reflective stacks were deposited o basal plane sapphire substrates using a low pressure MOCVD system. Triethylaluminum, triethylgallium and ammonia were used as the precursors. The substrates underwent a preclean prior to the epilayer depositions. Our growth conditions result inextremely smooth single crystal depositions. The single crystal nature was established using x-ray diffraction and RHEED data.

Subsequent to filter deposition we measured the interface abruptness and the thicknesses of individual stack layers (GaN and $Al_{0.2}Ga_{0.8}N$) using Zalar sputter Auger depth profiling procedure developed by the Physical Electronics Division of Perkin Elmer. The results showed that all 18 layers were clearly seen. An apparent variation of the Ga peak heights was an artifact of the Zalar sampling method due to the fact that the process had to be stopped at discrete intervals for Auger analysis.

The Zalar procedure produced approximately a 3 nm diameter crater with a high degree of bevelling. A scanning electron micrograph of the crater was used to determine the abruptness and thicknesses of the GaN/AlGaN layers in our stack. The measured thicknesses agreed well with the quarter wave design values. Auger linescans indicate the interface abruptness was better than 40 Å which is the measurement limit for the Zalar technique.

To get an independent confirmation on the thicknesses we measured the double crystal X-ray diffraction spectra for our reflector stacks. Observed multilayer periodic spectra centered around the (002) $Al_xGa_{1-x}N$ peak indicated excellent crystalline quality and uniform periodic nature of our superlattices. From the position of these peaks and a simple kinematic model we estimated the thicknesses of the GaN and the AlGaN layers of the single stack. Using these thickness values a good theoretical fit was obtained to the experimental data for a total stack thickness between 910-1000 Å. This was in excellent agreement with the designed theoretical value of 917 Å (for the 450 nm stack).

Figure 11:
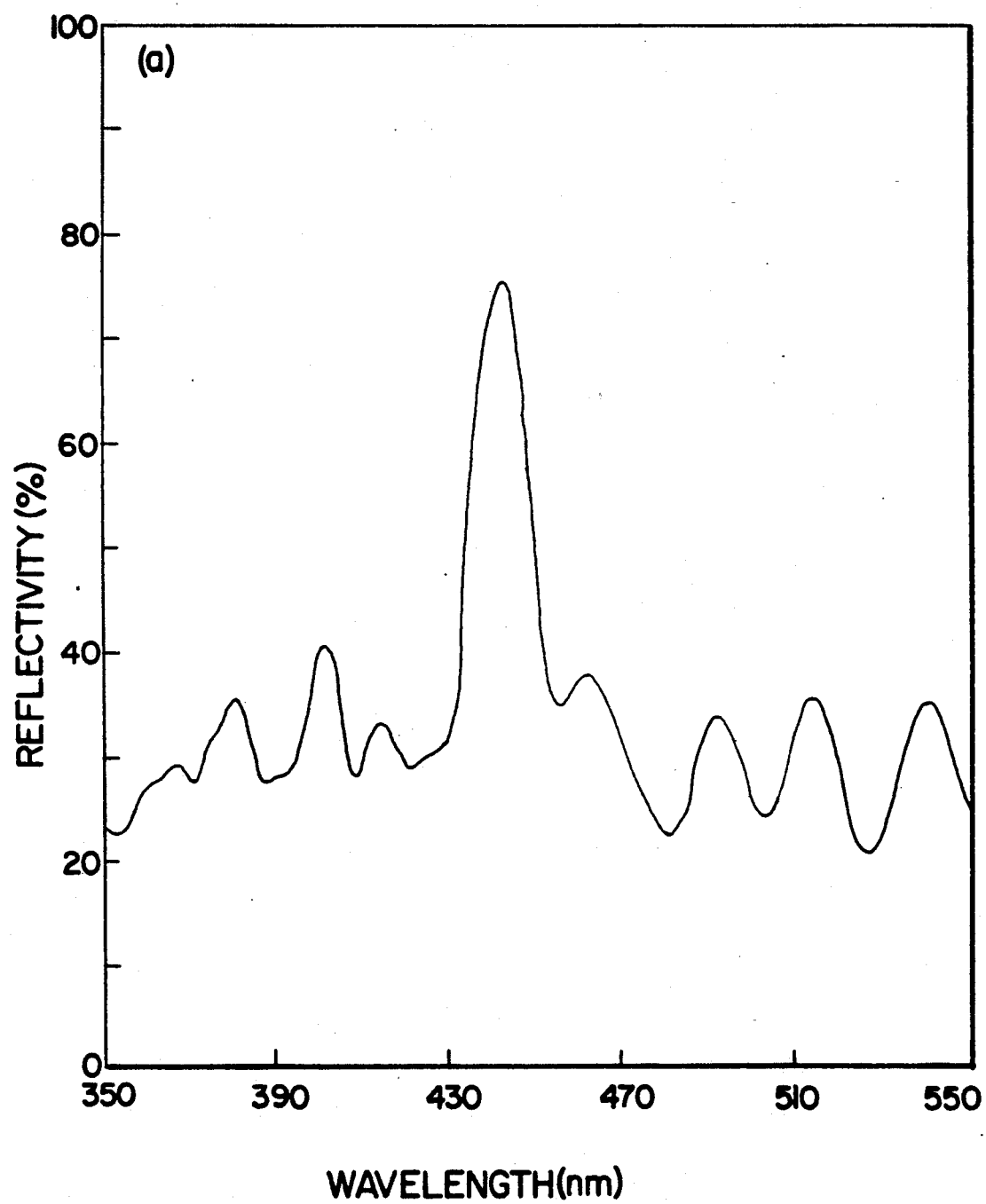
FIG. 11 is a graphical depiction of the bandgap reflectivity obtained from the 450 nm filter fabricated in Example 3.
Figure 12:
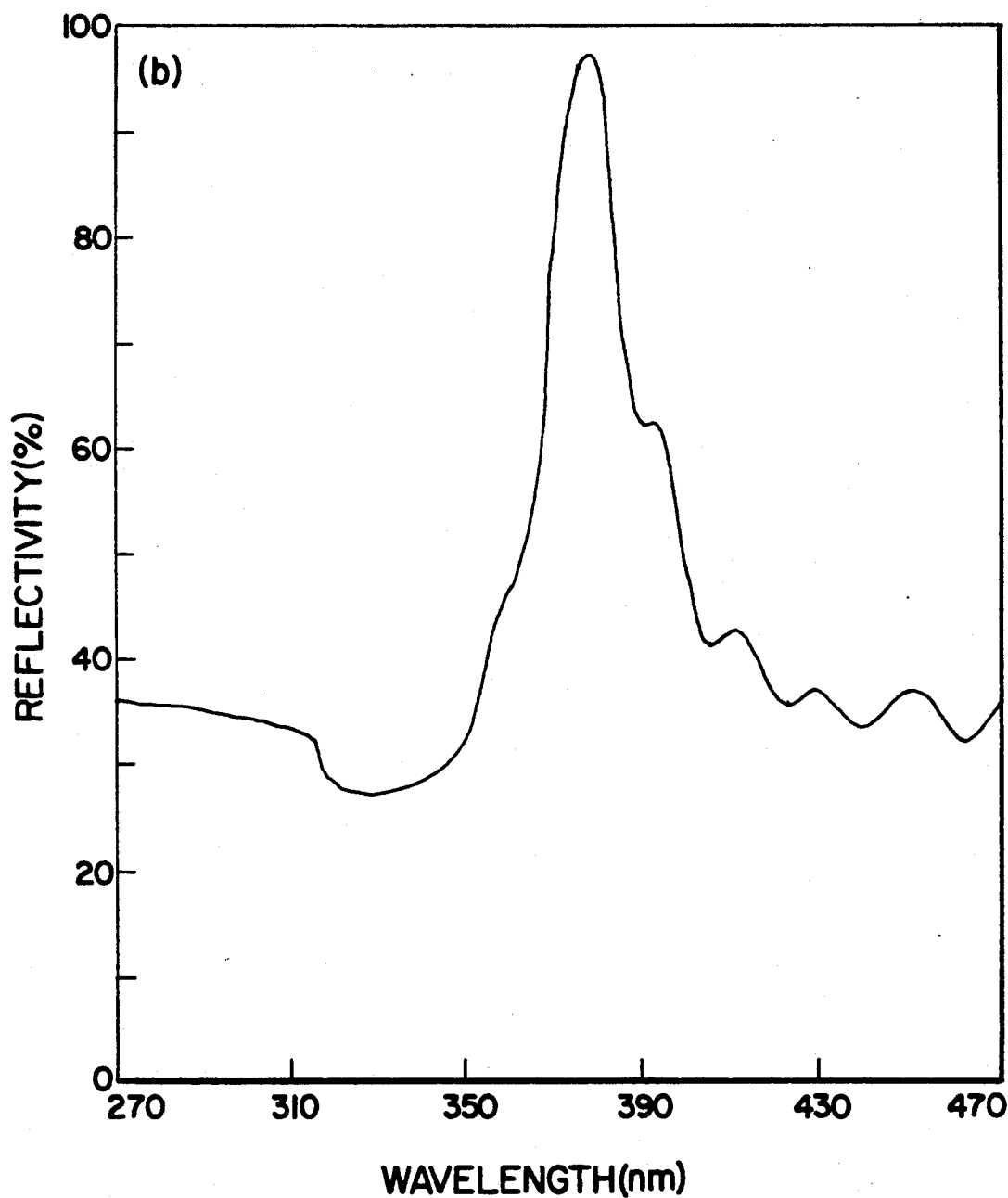
FIG. 12 is a graphical depiction of the bandgap reflectivity obtained from the 400 nm filter fabricated in Example 3.

The reflectivities of the two filter devices were then characterized as a function of wavelength using a UV-VIS spectrometer. These data for the 450 nm design showed a peak reflectivity of 80% centered at 442 nm (FIG. 11). This shift of 2% from the desired wavelength, results from day to day growth rate variations. The stack designed for 400 nm had a peak reflectivity of 95% centered at 375 nm indicating a 6% shift from the design (FIG. 12). As seen with both eighteen period stacks, peak reflectivities (80-95%) well over the 15% value for bulk $Al_xGa_{1-x}N$ were obtained. Also obtained were linewidths as sharp as 20 nm. These measured linewidth values agreed well with estimations based on the epilayer designs and the material refractive index values.

The above specification, examples and data provide a complete description of the manufacture and use of the composition of the invention. Since many embodiments of the invention can be made without departing from the spirit and scope of the invention, the invention resides in the claims hereinafter appended.

We claim as our invention:

1. A filter device of at least two layers, said first layer comprising $Al_xGa_{(1-x)}N$ wherein x has a value ranging from about 0 to 1, and said device second layer comprising $Al_yGa_{(1-y)}N$ wherein y has a value ranging from about 0 to 1, said filter device having a band width determined by $\gamma/4 = n_1 d_1 = n_2 d_2$ wherein $\gamma$ is the wavelength of the energy to be transmitted through the filter, $n_1$ is the refractive index of said first layer, $n_2$ is the refractive index of said second layer, $d_1$ is the thickness of said first layer and $d_2$ is the thickness of said second layer.

2. The device of claim 1 wherein x ranges in value from about 0.5 to 1 and y ranges in value from about 0.5 to 1.

3. The device of claim 1 wherein said first layer has a refractive index ranging from about 2.2 to 2.5 and said second layer has a refractive index ranging from about 2.2 to 2.5.

4. The device of claim 1 wherein said first layer has a thickness ranging from about 200 to 10,000 Angstroms and said second layer has a thickness ranging from about 200 to 5. The device of claim 1 wherein said first layer has a dielectric constant ranging from about 2.2 to 2.8, and said second layer has a dielectric constant ranging from about 2.2 to 2.8.

6. The device of claim 1 wherein said device transmits light having a wavelength ranging from about 270 nanometers to 310 nanometers, and wherein x ranges from about 0.3 to 1, y ranges from about 0.3 to 1, the refractive index of said first layer ranges from about 2.2 to 2.8, the refractive index of said second layer ranges from about 2.2 to 2.8, the thickness of said first layer ranges from about 200 to 600 Å, and the thickness of said second layer ranges from about 200 to 600 Å.

7. The device of claim 1 wherein said first and second layers are formed in repeating alternating sequence.

8. The filter device of claim 7 wherein said filter allows transmission of wavelengths ranging from about 200 to about 10,000 nm.

9. A detector device comprising:
(a) an ultraviolet detector; and
(b) a filter device of at least two layers, said first layer comprising $Al_yGa_{(1-x)}N$ wherein x has a value ranging from about 0 to 1, and said device second layer comprising $Al_yGa_{(1-y)}N$ wherein y has a value ranging from about 0 to 1, said filter device having a band width determined by $\gamma/4 = n_1 d_1 = n_2 d_2$ wherein $\gamma$ is the wavelength of the energy to be transmitted through the filter, $n_1$ is the refractive index of said first layer, $n_2$ is the refractive index of said second layer, $d_1$ is the thickness of said first layer and $d_2$ is the thickness of said second layer.

10. The device of claim 9 wherein x ranges in value from about 0.5 to 1 and y ranges in value from about 0.5 to 1.

11. The device of claim 9 wherein said first layer has a refractive index ranging from about 2.2 to 2.8 and said second layer has a refractive index ranging from about 2.2 to 2.8.

12. The device of claim 9 wherein said first layer has a thickness ranging from about 200 to 10,000 Angstroms and said second layer has a thickness ranging from about 200 to 10,000 Angstroms.

13. The device of claim 9 wherein said first layer has a dielectric constant ranging from about 2.3 to 2.8, and said second layer has a dielectric constant ranging from about 2.3 to 2.8.

14. The device of claim 9 wherein said device transmits light having a wavelength ranging from about 270 nanometers to 310 nanometers, and wherein x ranges from about 0.3 to 1, y ranges from about 0.3 to 1, the refractive index of said first layer ranges from about 2.2 to 2.8, the refractive index of said second layer ranges from about 2.2 to 2.8, the thickness of said first layer ranges from about 200 to 600 Å, and the thickness of said second layer ranges from about 200 to 600 Å.

15. The device of claim 9 wherein said first and second layers are formed in repeating alternating sequence.

16. The filter device of claim 9 wherein said filter allows transmission of wavelengths ranging from about 200 to about 10,000 Å.

17. A method of forming a filter device of at least two layers, said first layer comprising $Al_xGa_{(1-x)}N$ wherein x has a value ranging from 0 to 1, said device second layer comprising $Al_yGa_{(1-y)}N$ wherein y has a value ranging from about 0 to 1, said method comprising the step of determining the band width of a given layer by $\gamma/4 = n_1 d_1 = n_2 d_2$ wherein $\gamma$ is the wavelength of the energy to be transmitted through the filter, $n_1$ is the refractive index of said first layer and $n_2$ is the refractive index of said second layer, $d_1$ is the thickness of said first layer and $d_2$ is the thickness of said second layer.

18. The method of claim 17 wherein x ranges in value from about 0.5 to 1 and y ranges in value from about 0.5 to 1.

19. The method of claim 17 wherein said first layer has a refractive index ranging from about 2.2 to 2.5 and said second layer has a refractive index ranging from about 2.2 to 2.5.

20. The method of claim 17 wherein said first layer has a thickness ranging from about 200 to 10,000 Angstroms and said second layer has a thickness ranging from about 200 to 10,000 Angstroms.

21. The method of claim 17 wherein said first layer has a dielectric constant ranging from about 2.2 to 2.8, and said second layer has a dielectric constant ranging from about 2.2 to 2.8.

22. The method of claim 17 wherein said device transmits light having a wavelength ranging from about 270 nanometers to 310 nanometers, and wherein x ranges from about 0.3 to 1, y ranges from about 0.3 to 1, the refractive index of said first layer ranges from about 2.2 to 2.8, the refractive index of said second layer ranges from about 2.2 to 2.8, the thickness of said first layer ranges from about 200 to 600 Å, and the thickness of said second layer ranges from about 200 to 600 Å.

23. The method of claim 17 wherein said first and second layers are formed in repeating alternating sequence.

24. The method of claim 17 wherein said filter allows transmission of wavelengths ranging from about 200 to about 10,000 nm.

* * * * *

UNITED STATES PATENT AND TRADEMARK OFFICE
CERTIFICATE OF CORRECTION

PATENT NO. : 5,182,670

DATED : January 26, 1993

INVENTOR(S) : Muhammad A. Khan, Jonathan N. Kuznia, James M. Van Hove

It is certified that error appears in the above-identified patent and that said Letters Patent is hereby corrected as shown below:

In Column 11, line 24, insert --10,000 Angstroms-- after the word "to".

Signed and Sealed this

Twenty-third Day of November, 1993

Attest:

BRUCE LEHMAN

*Attesting Officer*   *Commissioner of Patents and Trademarks*